United States Patent [19]

Essig et al.

[11] Patent Number: 4,734,592

[45] Date of Patent: Mar. 29, 1988

[54] INTERFACE CIRCUIT FOR DATA PROCESSING SYSTEM

[75] Inventors: Daniel L. Essig; Joe F. Sexton, both of Houston, Tex.

[73] Assignee: Texas Instruments Incorporated, Dallas, Tex.

[21] Appl. No.: 9,579

[22] Filed: Jan. 28, 1987

Related U.S. Application Data

[63] Continuation of Ser. No. 547,557, Oct. 31, 1983.

[51] Int. Cl.⁴ .................. H03K 3/29; H03K 17/16; H03K 19/096; H03K 19/092

[52] U.S. Cl. .................................... 307/290; 307/443; 307/453; 307/475; 307/481

[58] Field of Search ............... 307/264, 290, 359, 443, 307/453, 475, 480, 481

[56] References Cited

U.S. PATENT DOCUMENTS

| | | | |
|---|---|---|---|
| 4,398,270 | 8/1983 | Taylor | 307/481 |
| 4,437,025 | 3/1984 | Liu et al. | 307/475 |
| 4,461,963 | 7/1984 | Koomen | 307/290 |
| 4,472,647 | 9/1984 | Allgood et al. | 307/475 |

Primary Examiner—John S. Heyman
Assistant Examiner—M. R. Wambach
Attorney, Agent, or Firm—John G. Graham; Rodney M. Anderson

[57] ABSTRACT

A data processing system which has an interface circuit that interfaces the data processing system to input devices. The interface includes an input means such as a pad for conducting signal levels from the interface devices to the data processing system. A digitizer, such as a Schmitt trigger, digitizes the signal levels to signal levels that are acceptable by the data processing system. An output line conditioner conditions the data lines that are connected to the digitizers to prevent overdriving of the data lines by the digitizers. Line drivers are used for driving the digitized system on the data lines throughout the data processing system.

6 Claims, 4 Drawing Figures 4,734,592

INTERFACE CIRCUIT FOR DATA PROCESSING SYSTEM

This is a continuation of application Ser. No. 547,557, filed Oct. 31, 1983.

BACKGROUND OF THE INVENTION

This invention relates to data processing systems and in particular, to data processing systems that are configured with field effect transistors on a single chip, and more particularly, to input buffer circuits associated with data processing systems that are implemented with field effect transistors on a single integrated circuit chip.

Data processing systems that are implemented on a single chip with field effect transistors are inherently slow, although economical to produce, due to the necessity of using multiple clocks to execute the associated or desired functions. Traditionally, a first clock is used to precharge the data lines, a second clock is used to set up the precharged data lines in circuits for receipt of data, and a third clock is used to implement the desired function. In applications where speed is not a necessary constraint on the application of the product, such as a hand-held calculator, the generation of clock signals with multiple phases allows the implementation of these circuits with relative ease. However, when the application of the devices is in an environment where speed is of the essence, and there are only a few clock phases provided, then the traditional method of implementing the field effect transistor circuits is difficult due to the limited number of clock phases and the additional requirement that the functions must be implemented within a single clock cycle.

Field effect transistor logic circuits operate with logic levels of nominally 0 V and 5 V, whereas the interface of the chip is based on TTL (Transistor/Transistor Logic) voltage levels where 0.8 V must be recognized as a low level and 2.0 V must be recognized as a high level. As cycle times have decreased a fast means to convert from TTL to field effect transistor logic circuits voltage levels have become necessary.

SUMMARY OF THE INVENTION

The present invention is a data processing system which has an interface circuit that interfaces the data processing system to input devices. The interface circuit includes an input means such as a pad for conducting signal levels from the interface devices to the data processing system. A digitizer, such as a Schmitt trigger, digitizes the signal levels to signal levels that are acceptable by the data processing system. An output conditioner conditions the data lines that are connected to the digitizers to prevent overdriving of the data lines by the digitizers. Line drivers are used for driving the digitized system on the data lines throughout the data processing system.

The data processing system includes a plurality of interfaces so that the data may be transferred from the input device to the data processing system in words, half-words or byte configuration.

A microprocessor system implementing the input buffer with zero set up times is provided.

These embodiments, as well as advantages and objectives of the invention, may be ascertained from reading of the specification in combination with the figures.

DETAILED DESCRIPTION OF THE PREFERRED EMBODIMENT

Figure 1:
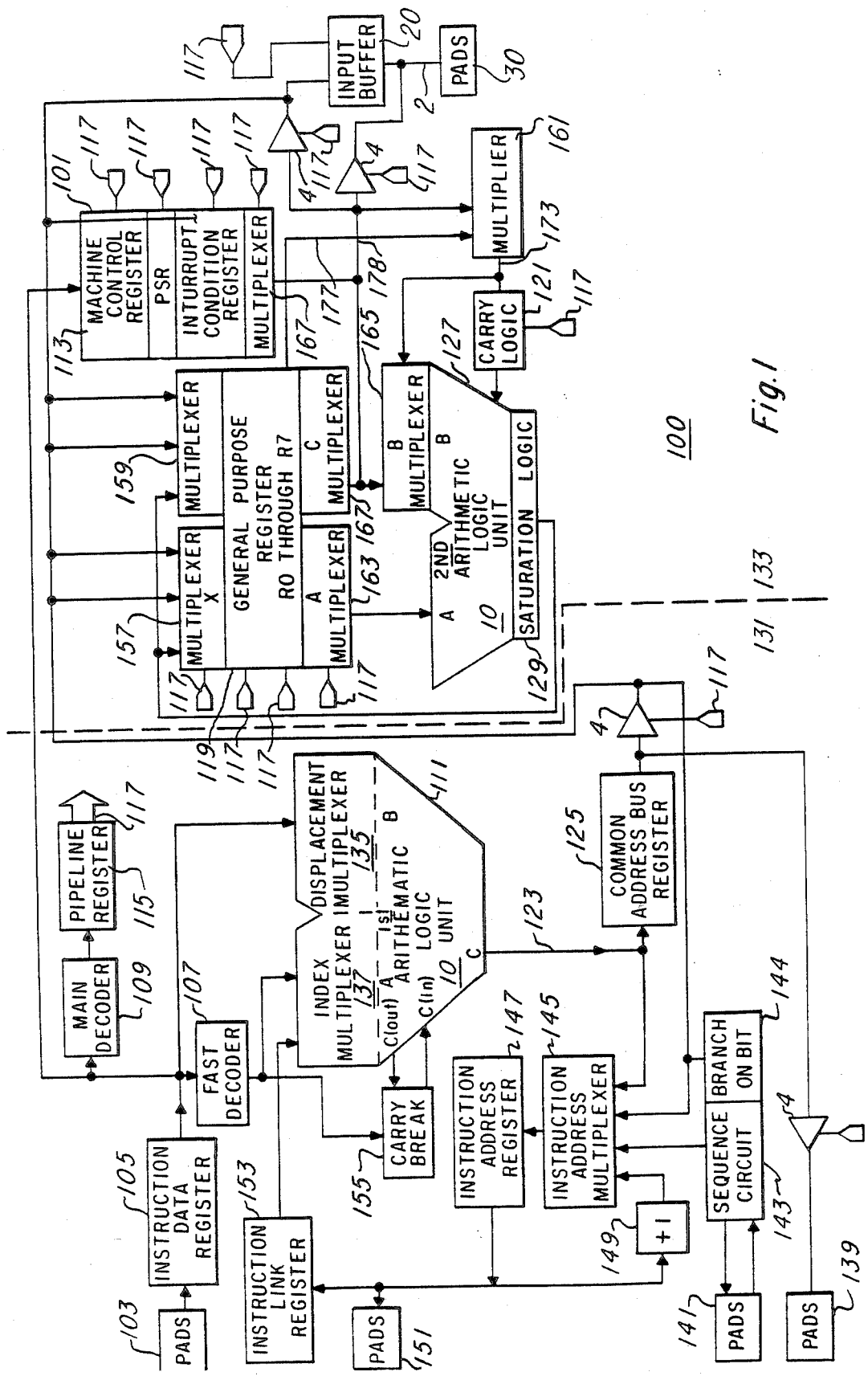
FIG. 1 is a block diagram of a data processing system, and in particular, a microprocessor, utilizing the input buffer according to the invention.

In FIG. 1, there is illustrated a microprocessor which incorporates an input buffer I/O according to the invention. Instructions from an I/O terminal (not shown) are provided via the pads 103 to an instruction data register 105 and are then applied to a fast decoder 107, a main decoder 109, and an address arithmetic logic unit 111. The main decoder 109 decodes the instructions into control signals which are used throughout the microprocessor. These control signals are stored in the control pipeline register 115 which conveys the decoded signals via data bundle 117 to the appropriate circuitry including the multiplier 161.

The microprocessor 100 has essentially two portions, an instruction portion represented in the area of 131 and a data portion represented in the area of 133. The addres arithmetic logic unit 111 receives data from the instruction data register 105 via a displacement multiplexer 135 as well as data from the instruction link register 153 or the general purpose register 119 via the index multiplexer 137, based on the results of the fast decoder 107.

After the appropriate arithmetic logic operation is performed as directed by the carry break logic 155, the output 123 of the address arithmetic logic unit 111 is latched in the common address bus register 125. The output of this register may subsequently be applied to the I/O of the integrated circuit via pads 139 to address either the data memory or input/output address space or to an internal bus for use as a constant. The output 123 of the address arithmetic logic unit 111 is also applied to the instruction address multiplexer 145. The output of this multiplexer is latched in the instruction address register 147. Another input to the multiplexer, an incremented version of the instruction address register, is provided by increment by 1 device 149. The control of the multiplexer 145 is provided by the sequencing circuit 143. The sequencing circuit 143 controls branches and interrupts which may be received via the pads 141. The output of the instruction address register 147 is applied to the I/O via pads 151 for addressing an instruction in memory. The instruction address register 147 is also latched in the instruction link register 153 after a one-day cycle delay.

The arithmetic logic unit 127 receives data via input buffer 20 and pads 30 and from a general purpose register 119 via A multiplexer 163 and data from a general purpose register 119, machine control register 113, program status register or interrupt condition register via the C multiplexer 167 or from the multiplier 161 via the B multiplexer 165. The carry into the arithmetic logic unit 127 is from the carry logic 121 under the control of the main decoder 109. The output of the arithmetic logic unit 127 may be adjusted in the case of an overflow by the saturation logic 129. The output is then fed back to the general purpose registers 119 via the X multiplexer 157 and Y multiplexer 159.

When an instruction calling for a multiplication is decoded by the main decoder 107, the multiplier 161 performs the function.

Figure 2:
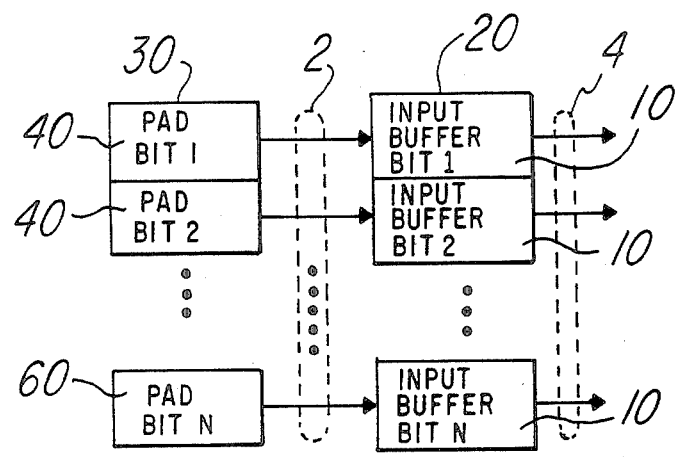
FIG. 2 is a block diagram of the interface circuit that is used to interface the microprocessor of FIG. 1 with an input device.

In FIG. 2, to which reference should now be made, there is shown the pads 30 as well as the input buffer 20 of FIG. 1. The pads 30 include an individual pad 40 for each bit that is provided from an input device such as an I/O terminal to the microprocessor 100 of FIG. 1. Connected to each pad 40 is an input buffer 10. Data bundle 2 connects the pads 40 to the respective input buffers 10 and data bundle 4 interfaces the input buffers 10 to the data processing system which in the embodiment of FIG. 1 is the data bus 4.

Figure 3:
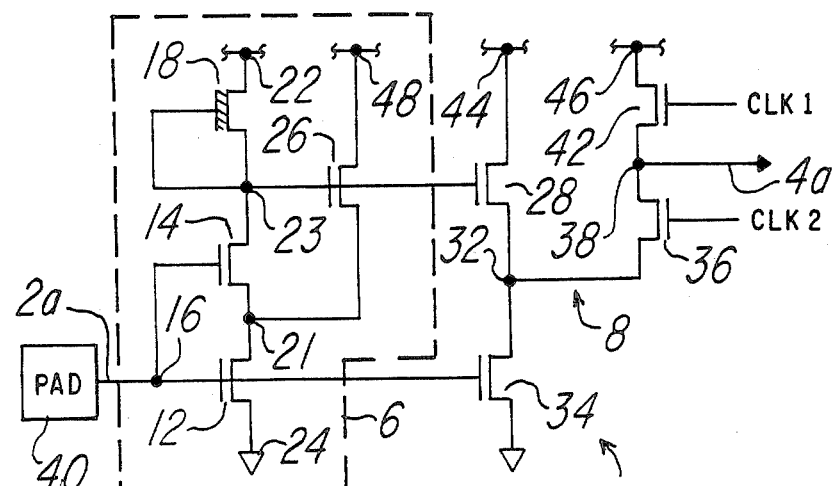
FIG. 3 is a schematic diagram of an imput buffer of FIG. 2.

FIG. 3 is a schematic diagram of the input buffer and pads and includes a single data pad 40 which is connected to the input of a Schmitt trigger circuit 6 and the gate of transistor 34. Most I/O devices such as data terminals utilize TTL type logic circuits, and consequently, the logic voltage levels are different than those encountered with field effect transistor logic. Additionally, the input devices operate in a noisy environment where they are subjected to electromagnetic fields from motors, etc., and traditionally have a noise associated with the circuits. The Schmitt trigger device, of course, has built-in hysteresis loop which provides constant signal levels and minimizes thereby the effect of the noise.

The Schmitt trigger 6 digitizes the voltage at node 16 into its logical inverse and provides voltages acceptable to field effect transistor logic circuits at node 23. This is done by transistors 12, 14, 18, and 26 of Schmitt trigger 6. Being a binary circuit, there are two cases to consider. In both cases CLK1 clock precharges the output node 38 via transistor 42. In the first case of a logic 1 input, the pad 40 is at 2. V or higher. The node 23 of the Schmitt trigger 6 will be low. Transistor 34 will be driven on by the 2 V on its gate. Transistor 28 will be off. When the CLK2 clock is turned on, the charge on node 38 is discharged through transistors 36 and 34. In the second case of a logic zero input, the pad 40 is at 0.8 V or lower. The node 23 of the Schmitt trigger 6 will be high. Transistor 34 may be slightly on because the threshold voltage of the enhancement field effect transistor has been set to approximately 0.6 V for optimal operation of the internal circuitry. In spite of transistor 34 being slightly on, transistor 28 is driven fully on and node 32 is held at a sufficiently high voltage so that the charge on node 38 is not discharged when the CLK2 clock is turned on.

Further study of the circuit under transient conditions will reveal the speed advantage over other approaches. Again there are two cases. One case is a low-to-high transition on the input. Since the input is tied directly to transitor 34, the input need not be valid before the start of CLK2 clock. The sizes of transistors 28 and 34 and hence their current capacities are such that the node 38 can begin discharging even before the node 23 of the Schmitt trigger 6 has switched low. The other case is a high-to-low transition on the input. If the input switches coincident with the start of the CLK2 clock, node 38 will begin to slowly discharge since transistor 36 is on and transistor 34 may be slightly on. However, node 38 will not be significantly discharged before the node 23 of the Schmitt trigger 6 switches high and turns on transistor 28 which prevents further discharge by driving node 32 high.

A condition circuit 8 is provided by the series combination of field effect transistors 28 and 34. This conditioning is necessary to prevent the overdriving of data line 4A by the logic levels that are provided to the pad 40 from the I/O terminal. Field effect transistor 36 has its source connected to node 38, which is also connected to Vcc via field effect transistor 42, and its drain connected to node point 32, which happens also to be the source of field effect transistor 34 which is connected to the reference potential. A line driver circuit is provided by the field effect transistors 42 and 36. At clock 1, CKL1, field effect transistor 42 is turned on and the data line 4A is precharged by the connection of node point 46 to node point 38. Node point 46 is connected to Vcc. At clock 2, CLK2, the output of the Schmitt trigger 6, as controlled by the operation of the field effect transistors 34 and 36, is applied to the data line 4A in the complement form in the embodiment shown. Conductor 2A is directly connected to the gate of field effect transistor 34 and the operation of the Schmitt trigger 6, essentially allows the input buffer 10 to operate without a set up time.

Figure 4:
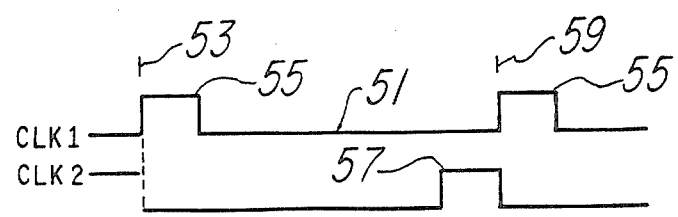
FIG. 4 is a waveform diagram illustrating the clock cycles used in the invention.

FIG. 4 is a waveform diagram illustrating the waveforms of the clock one and the clock two signals. Waveform 51 is a waveform of the clock 1 signal, CLK1, with the cycle beginning at line 53 and providing a pulse 55 at each cycle. Sometime thereafter, the clock 2 pulse, CLK2, occurs and has the requirement that it occur after the pulse 55. This is indicated by waveform 57 which occurs after the pulse 55 of the cycle that begins with line 53, but prior to the pulse 55 of the cycle that begins with line 59.

Although the present invention has been described in relation to a specific preferred embodiment, it will be clearly understood by those skilled in the art that other optional features may be included within the multiplier or substituted for features described without departing from the scope of the invention.

What is claimed is:

1. An interface circuit for a data processing apparatus comprising:
   a data input for receiving an input data signal;
   a digitizer circuit having an input and having an output, said input of said digitizer circuit being connected to said data input, for generating at its output a digital signal having a first logic state corresponding to said input data signal being at a voltage less than a first predetermined level, and having a second logic state corresponding to said input data signal being at a voltage greater than a second predetermined level;
   an output line conditioner circuit, comprising:
      a first switch means, connected between a first power supply node and an output node of said output line conditioner circuit, and connected to the output of said digitizer circuit, for connecting said first power supply node to said output node responsive to said digital signal being in its first logic state, and for isolating said first power supply node from said first power supply responsive to said digital signal being in its second logic state; and
      a second switch means, connected between a second power supply node and said output node, and connected to said data input for connecting said second power supply node to said output of said output line conditioner circuit responsive to said data input being at a voltage greater than said second predetermined level; and a line driver having an input connected to said output node of said output line conditioner for driving an output data line responsive to said voltage of said output node.

2. An interface circuit as claimed in claim 1, wherein:
said digitizer circuit comprises an inverting Schmitt trigger circuit.

3. An interface circuit as claimed in claim 2, wherein said first switch means comprises:

a first field effect device having its source-to-drain path connected between said first power supply node and said output node, and having its gate connected to said output of said digitizer circuit; and wherein said second switch means comprises:

a second field effect device having its source-to-drain path connected between said output node and said second power supply node, and having a gate connected to said data input.

4. An interface circuit for a data processing apparatus comprising:

a data input for receiving an input data signal;

an inverting Schmitt trigger circuit having an input connected to said data input for generating at its output a digital signal at a first logic state responsive to said input data signal received by said data input being at a voltage below a first predetermined level, and at a second logic state responsive to said input data signal being at a voltage above a second predetermined level;

an output line conditioner circuit including a first field effect device having its source-to-drain path connected between a first power supply node and a first output node, and having its gate connected to said output of said digitizer circuit so that said first field device connects said first power supply node to said first output node responsive to said digital signal being at its first logic state and so that said first output node is isolated from said first power supply node responsive to said digital signal being at its second logic state, and a second field effect device having its source-to-drain path connected between said first output node and a second power supply node, and having a gate connected to said data input so that said second field effect device connects said second power supply node to said first output node responsive to said data input being at a voltage greater than said second predetermined level, said output line conditioner circuit for generating an output signal on said first output node having a voltage level restricted between said the voltages of said first and second power supply nodes; and a line driver including a third field effect device having its source-to-drain path connected between said first power supply node and a second output node, and having its gate connected to receive a first clock signal, and a fourth field effect device having its source-to-drain path connected between said second output node and said first output node, and having its gate connected to receive a second clock signal, said first clock signal for precharging said second output node via said third field effect device, said second clock signal for discharging said second output node via said fourth field effect device dependent upon the voltage on said first output node, wherein said second output node is the output of said interface circuit.

5. An interface circuit as claimed in claim 4, wherein:
said first and second field effect devices of said output line conditioner circuit are constructed with their width-to-length ratios sized relative to one another so that the voltage of said first output node is pulled toward the voltage of said second power supply node responsive to said input data signal being at or above its second predetermined level, prior to said digital signal reaching its second logic state and causing said first field effect device to isolate said first output node from said first power supply node.

6. An interface circuit as claimed in claim 5, wherein:
said first and second field effect devices of said output line conditioner circuit are constructed to match transistor-transistor logic signal levels to field effect transistor logic signal levels.

* * * * *